US007315802B1

(12) United States Patent
Jenkins, IV

(10) Patent No.: US 7,315,802 B1
(45) Date of Patent: Jan. 1, 2008

(54) METHODS OF LOGIC REDUCTION IN ELECTRICAL CIRCUITS UTILIZING FAULT SIMULATION

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 880 days.

(21) Appl. No.: 10/430,588

(22) Filed: May 6, 2003

(51) Int. Cl.
*G06F 17/50* (2006.01)
(52) U.S. Cl. .................... 703/14; 714/738; 716/2; 716/6
(58) Field of Classification Search ............. 703/14, 703/16; 716/2, 4–6; 714/734, 738
See application file for complete search history.

(56) References Cited

U.S. PATENT DOCUMENTS

| 5,384,720 | A | * | 1/1995 | Ku et al. ................... 703/16 |
| 5,960,188 | A | * | 9/1999 | Linke et al. ................ 703/14 |
| 6,327,557 | B1 | * | 12/2001 | Croix ......................... 703/14 |
| 6,721,914 | B2 | * | 4/2004 | Bartenstein et al. ......... 714/734 |

OTHER PUBLICATIONS

Geilert et al., M. On the Efficiency of the Transition Fault Model for Delay Faults, 1990 IEEE International Conference on Computer-Aided Design, Nov. 1990, pp. 272-275.*
Bryant et al., R.E. Performance Evaluation of FMOSSIM, a Concurrent Switch-Level Fault Simulator, IEEE, 22nd Conference on Design Automation, Jun. 1985, pp. 715-719.*
Kubiak et al., K. Rapid Integrated-Circuit Reliability-Simulation and Its Application to Testing, IEEE Transactions on Reliability, vol. 41, No. 3, Sep. 1992, pp. 458-465.*
Heinitz et al., M. Automatic Fault Diagnosis for Scan-Based Designs, Microelectronic Engineering, vol. 31, Feb. 1996, pp. 331-338.*
Jin et al., W. FastSlim: Prefetch-Safe Trace Reduction for I/O Cache Simulation, ACM Transactions on Modeling and Computer Simulation (TOMACS), vol. 11, No. 2, Apr. 2001, pp. 135-160.*
Kaplan et al., S.F. Trace Reduction for Virtual Memory Simulations, ACM SIGMETRICS Performance Evaluation Review, Proceedings of the 1999 ACM SIGMETRICS International Conference on Measurement and Modeling of the Computer Systems, May 1999, pp. 47-58.*
McGeoch, C. Analyzing Algorithms by Simulation: Variance Reduction Techniques ands Simulation Speedups, ACM Computing Surveys, vol. 24, No. 2, Jun. 1992, pp. 195-212.*
Kaplan et al., S.F. Flexible Reference Trace Reduction for VM Simulations, ACM Transactions on Modeling and Computer Simulations, vol. 13, No. 1, Jan. 2003, pp. 1-38.*

* cited by examiner

*Primary Examiner*—Russell Frejd
(74) *Attorney, Agent, or Firm*—Lois D. Cartier

(57) ABSTRACT

Methods of reducing the amount of logic in a digital circuit without affecting the functionality of the circuit. A circuit description and one or more test patterns are supplied to a fault simulator. The fault simulator runs the test patterns on the circuit, and identifies any nodes that did not transition in either direction ("non-transitioning nodes"). If the test patterns provide full coverage of the desired functionality for the circuit, each of the non-transitioning nodes is unnecessary to the logical functionality of the circuit in the target application. Therefore, the logic driving the non-transitioning nodes is removed from the circuit. The modified circuit can then be re-simulated, if desired, to verify that the relevant functionality of the circuit has not changed.

30 Claims, 3 Drawing Sheets

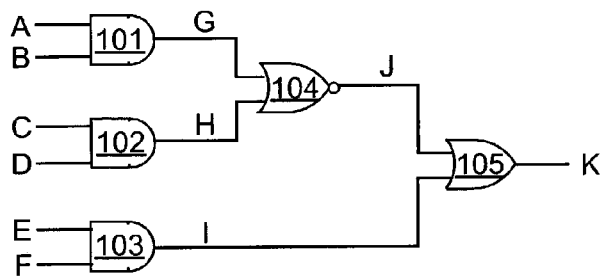
FIG. 1
FIG. 3
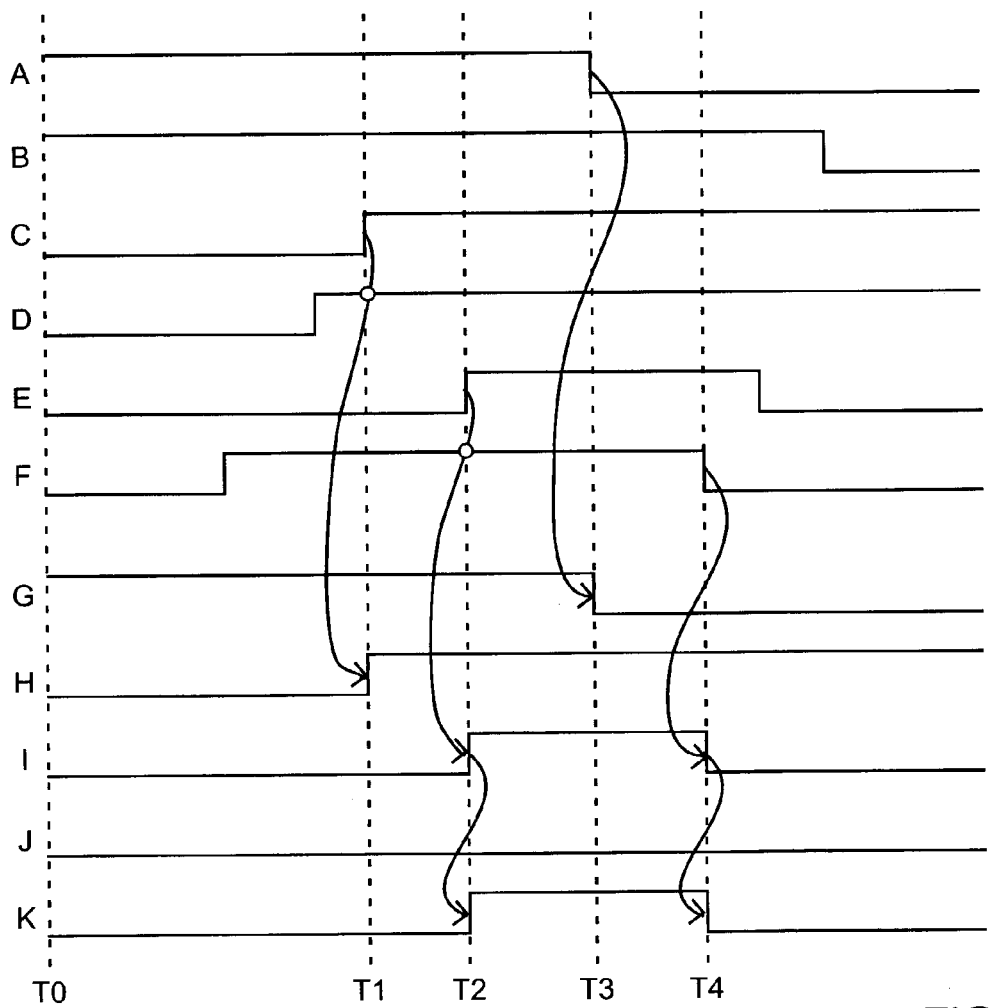
FIG. 2

METHODS OF LOGIC REDUCTION IN ELECTRICAL CIRCUITS UTILIZING FAULT SIMULATION

FIELD OF THE INVENTION

The invention relates to methods of reducing the amount of logic included in an electrical circuit. More particularly, the invention relates to logic reduction methods utilizing the results of a fault simulation performed on the electrical circuit.

BACKGROUND OF THE INVENTION

As the number of logic gates in an integrated circuit (IC) increases, IC logic design becomes a disproportionately more complex process. At one time, a typical IC included only a few tens of thousands of logic gates. It is now common for an IC to include millions of logic gates. A circuit that includes millions of logic gates can be much more difficult to specify, design, and test than a smaller circuit.

One common approach to creating a large circuit is to specify the behavior of the circuit in a high-level design language such as HDL or VHDL. Computer software accepts this behavioral circuit description and generates a corresponding circuit netlist. (A "netlist" is a description of a circuit comprising a list of lower-level circuit elements, gates, or netlists and the connections (nets or nodes) between the outputs and inputs thereof.) The use of a behavioral circuit description can result in a netlist of less than perfect efficiency. Because predefined and automated procedures are followed in generating the circuit implementation, logic can sometimes be included in the netlist that is not actually utilized by the circuit.

Another common approach to creating a large circuit is to utilize pre-designed sub-circuits or modules, i.e., portions of the circuit that have previously been created and tested. Because these modules have already been designed and verified, their use can greatly improve both the design cycle time and the speed and accuracy of the resulting circuit. However, the module designers are typically attempting to satisfy a wide user base. Therefore, they tend to include in the modules whatever capabilities might be of use to their potential customers. Module users who do not need or desire some of these capabilities can find themselves with a circuit netlist that includes logic elements not used in their target application.

To accommodate these unused logic elements, some IC design software includes a "trimming" feature, whereby logic that drives unused nodes is automatically trimmed from the circuit. In other words, if a node has a source but no destination, the logic driving the node is removed from the circuit. Sometimes nodes without a destination are actually necessary in a design, such as when deliberately mimicking the loading on another node. Therefore, this type of software can include some mechanism for marking logic to be retained even if the output node has no destination. However, in general, it is desirable to eliminate unused logic, as smaller circuits lead to lower costs for both manufacturers and end users of the circuit.

Verifying the functionality and timing of large and complex ICs is also no small task. To test the logical behavior of the design, the circuit description (e.g., the behavioral description or netlist) is typically carefully simulated. Using a computer to simulate the behavior of the circuit, high and low values are assigned to selected nodes (e.g., input nodes), and the values of various other nodes are monitored and compared to expected data. Discrepancies are investigated, and their causes are found and corrected. Some simulators can also mimic the timing to be expected from a circuit after manufacture, based on a detailed circuit description that includes transistor sizes and device models.

Additional testing is performed after the IC has been manufactured. Even if the logical design of the circuit is flawless, the manufacturing process can produce flawed devices, e.g., devices including shorts between metal traces on the die, or opens creating gaps in what should be a single trace. Therefore, a set of test vectors (i.e., one or more test patterns) are applied to the IC. Ideally, the complete set of test patterns ensures that each node in the entire circuit can toggle successfully in both directions between high and low values.

The term "fault coverage" is used to denote the percentage of nodes in the IC that are actually tested by a set of test patterns. For example, the term can refer to the percentage of nodes that make both high-to-low and low-to-high transitions when subjected to the set of test patterns. The term can also be used to refer to the percentage of nodes that assume both high and low values. Ideally, the fault coverage for a set of test patterns is one hundred percent (100%).

Test time can contribute significantly to the cost of IC production. Therefore, there is value in minimizing the length of time required to run the full set of test patterns, while still achieving one hundred percent fault coverage. Hence, software tools have been developed that allow the assessment of test patterns for the amount of fault coverage they provide.

A fault coverage simulator (fault simulator) accepts a circuit description (e.g., a netlist for an entire IC) and a set of test patterns to be evaluated. The circuit is then simulated using the test patterns to supply the input stimulus. For the purpose of fault analysis, it is not necessary to compare the actual values computed for the output nodes with the expected values. Instead, as the simulation progresses, the fault simulator monitors and records each node in the circuit, and keeps track of which nodes actually switch and in which direction (i.e., high-to-low and/or low-to-high). The fault simulator provides the resulting record to the user, who can then alter the test patterns to appropriately toggle the reported untested nodes, and reassess the test patterns for improved fault coverage. The goal is to achieve one hundred percent fault coverage for the circuit from a minimal set of input vectors for the design.

Therefore, it is desirable to provide both efficient circuit implementations and efficient test patterns providing one hundred percent fault coverage for the circuit implementations.

SUMMARY OF THE INVENTION

The invention provides methods of reducing the amount of logic in a digital circuit without affecting the functionality of the circuit. A circuit description and one or more test patterns are supplied to a fault simulator. The fault simulator runs the test patterns on the circuit, and identifies any nodes that did not transition in either direction ("non-transitioning nodes"). If the test patterns provide full coverage of the desired functionality for the circuit, each of the non-transitioning nodes is unnecessary to the logical functionality of the circuit in the target application. Therefore, the logic driving the non-transitioning nodes is removed from the circuit. The modified circuit can then be re-simulated, if desired, to verify that the relevant functionality of the circuit has not changed.

According to a first embodiment, a method of reducing the size of a circuit includes running a fault simulator on the circuit using a first set of test patterns and identifying non-transitioning nodes, and modifying the circuit to remove logic driving the non-transitioning nodes. The first set of test patterns provides full coverage of desired functionality for the circuit. If desired, the modified circuit can then be simulated using a second set of test patterns to verify that the functionality is unchanged. The first and second sets of test patterns can be the same or different test patterns. In some embodiments, modifying the circuit to remove logic driving the non-transitioning nodes includes retaining logic that drives non-transitioning nodes marked for retention.

In some embodiments, the fault simulator creates a list of the non-transitioning-nodes. In other embodiments, the fault simulator is integrated with the software that modifies the circuit to remove the logic, and the unnecessary logic is removed as soon as its status is identified.

In some embodiments in which a list is created, the method also includes checking the list to discover whether the first set of test patterns should be modified to cause the non-transitioning nodes to transition, and then modifying the first set of test patterns to cause at least one of the non-transitioning nodes to transition.

In some embodiments, the circuit is a user circuit to be implemented in a programmable logic device (PLD). In some of these embodiments, the method further includes implementing the modified circuit in the PLD.

According to another embodiment, a method of reducing the size of a circuit includes accepting a circuit description of the circuit and a test pattern providing full coverage of desired functionality for the circuit, identifying non-transitioning nodes when the test pattern is applied to the circuit, and modifying the circuit to remove logic driving the non-transitioning nodes. The non-transitioning nodes are identified based on the previously-supplied circuit description and the test pattern. In some embodiments, modifying the circuit to remove logic driving the non-transitioning nodes includes retaining logic that drives non-transitioning nodes marked for retention.

In some embodiments, the circuit is a user circuit to be implemented in a PLD. In some of these embodiments, the method also includes placing and routing the modified circuit in the PLD and, in some embodiments, providing configuration data for the circuit placed and routed in the PLD.

Another embodiment includes a computer-readable storage medium comprising computer-executable code for reducing the size of a circuit. The computer-executable code includes code for identifying, based on a circuit description of the circuit and a test pattern providing full coverage of desired functionality for the circuit, non-transitioning nodes when the test pattern is applied to the circuit, and code for modifying the circuit to remove logic driving the non-transitioning nodes. In some embodiments, the computer-readable storage medium also includes the circuit description of the circuit. In some embodiments, the computer-readable storage medium also includes the test pattern. In some embodiments, the code for modifying the circuit to remove logic driving the non-transitioning nodes includes code for retaining logic that drives non-transitioning nodes marked for retention.

In some embodiments, the circuit is a user circuit to be implemented in a PLD. In some of these embodiments, the computer-readable storage medium also includes code for placing and routing the modified circuit in the PLD. In some embodiments, the computer-readable storage medium also includes code for providing configuration data for the circuit placed and routed in the PLD. In some embodiments, the code for identifying the non-transitioning nodes includes code for creating a list of the non-transitioning nodes.

According to another embodiment, a computer system is provided that includes modules for performing each step of the method described above.

BRIEF DESCRIPTION OF THE DRAWINGS

The present invention is illustrated by way of example, and not by way of limitation, in the following figures.

FIG. 1 shows an exemplary circuit to be reduced in size according to the invention.

FIG. 2 is a waveform diagram illustrating the functionality of the circuit of FIG. 1.

FIG. 3 shows a modified circuit created by modifying the circuit of FIG. 1 according to the methods of the invention.

DETAILED DESCRIPTION OF THE DRAWINGS

Figure 4:
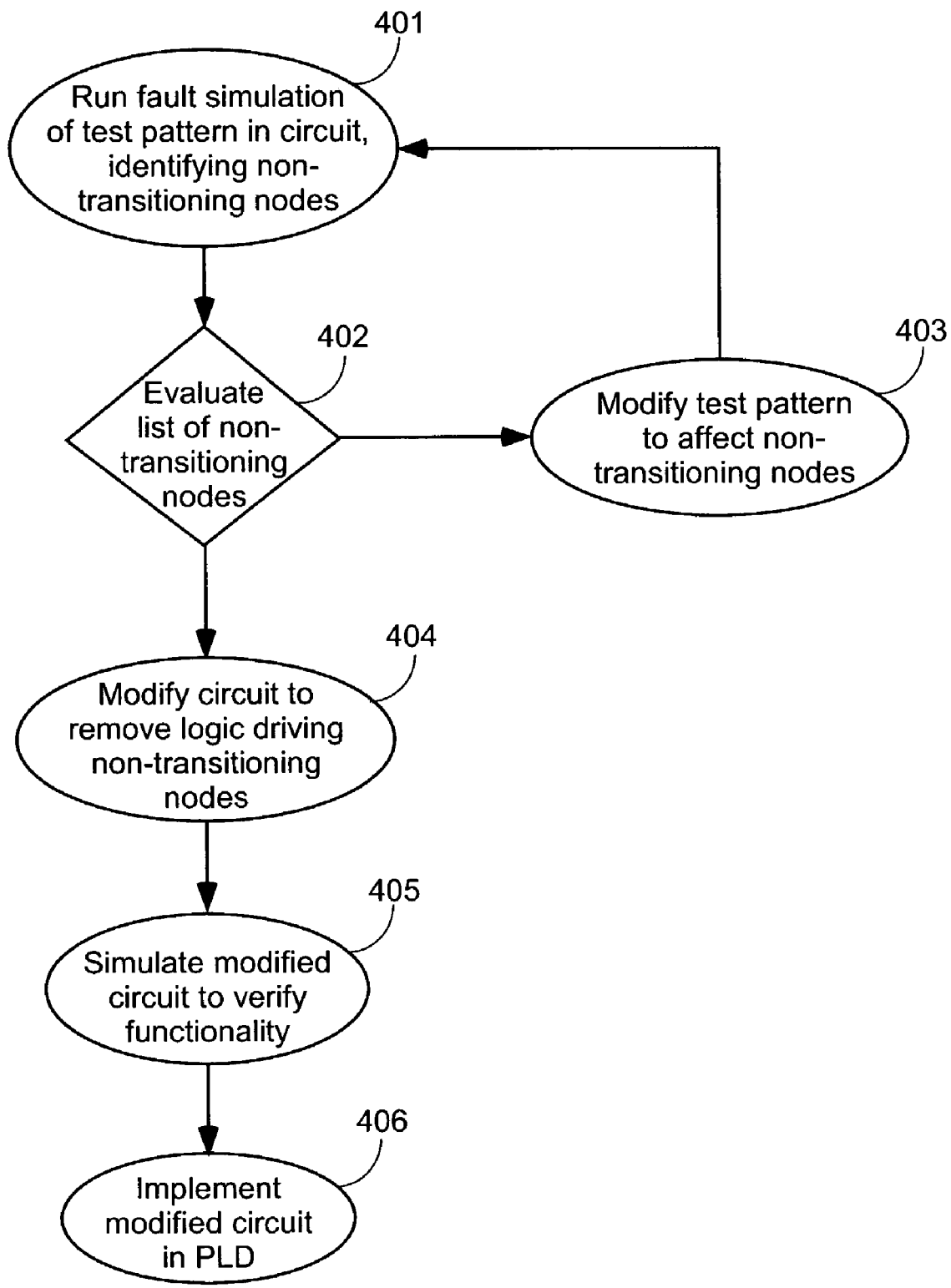
FIG. 4 illustrates the steps of a first method of reducing the size of a circuit, according to one embodiment of the invention.

The present invention is applicable to a variety of systems and methods for reducing the size of an electronic circuit. The present invention has been found to be particularly applicable and beneficial for circuits to be implemented in programmable logic devices (PLDs). However, the present invention is not so limited. An appreciation of the present invention is presented by way of specific examples, in this instance with a user circuit targeted to a PLD.

FIG. 1 illustrates a simple exemplary circuit to be implemented in a PLD. (Actual circuits on which the methods of the invention are practiced can be much larger and more complex.) The circuit includes AND gates 101-103, NOR gate 104, and OR gate 105. AND gate 101 is driven by input signals A and B, and drives node G. AND gate 102 is driven by input signals C and D, and drives node H. AND gate 103 is driven by input signals E and F, and drives node I. NOR gate 104 is driven by nodes G and H, and drives node J. OR gate 105 is driven by nodes J and I, and drives node K. (In the present specification, the same reference characters are used to refer to terminals, signal lines, waveforms, and their corresponding signals.)

Note that in the absence of any further data, none of logic gates 101-105 can be removed from the circuit without sacrificing functionality.

However, according to the present invention, a test pattern is also provided that causes the input signals A-F to assume all value combinations that will be encountered in the actual operation of the circuit. In other words, the test pattern provides full coverage of desired functionality for the circuit. This does not necessarily mean that the test pattern provides one hundred percent fault coverage for the circuit. For example, in some cases (e.g., when circuits are automatically generated by computer software), circuits include logic gates that are never used. In other cases, some circuits include logic gates that are used only in some applications of the circuit.

FIG. 2 illustrates an exemplary test pattern that can be applied to the circuit of FIG. 1. (Test patterns applied to actual ICs are typically much longer and more complex.) Inputs to the circuit include signals A-F. In the present example, all value combinations for signals A-F that will be encountered during actual operation are illustrated in the first six waveforms (A-F) shown in FIG. 2.

At time T0, signals A and B are high, and signals C-F are low. Thus, signal G is high, and signals H-K are low. Signals F and D go high without having any effect on the circuit. However, at time T1, signal C goes high. Because signal D is already high, node H goes high. At time T2, signal E goes high. Because signal F is already high, node I goes high, in turn causing output node K to go high. At time T3, signal A goes low, causing node G to go low. At time T4, signal F goes low, causing node I to go low, which in turn causes output node K to go low. Signals E and B then go low without affecting the values of any other nodes.

Note that at no time in the illustrated test pattern does node J ever change state. As previously stipulated, the test pattern provides full coverage of desired functionality for the circuit. Therefore, when the circuit is in actual use for the target application, node J will never go high, even though node J does not appear redundant when viewed outside the context of the test pattern.

Thus, node J can be removed from the circuit without changing the functionality of the circuit as defined by the test pattern in FIG. 2. To remove node J from the circuit, the logic driving node J (gates 101, 102, and 104) is removed, and OR gate 105 is modified to remove the influence of node J. In this example, the removal of node J from a 2-input OR gate (105) leaves a simple wire. In other examples (not shown), the logic gate previously driven by a removed node is modified to remove the node, but still remains in the circuit. For example, if OR gate 105 were a 3-input OR gate, removing node J as an input would leave a 2-input OR gate driven by the other two input signals.

FIG. 3 illustrates the circuit remaining after modifying the circuit of FIG. 1 to remove the logic driving node J, i.e., a simple 2-input AND gate 301 driven by input signals E and F and providing output node K. Referring again to FIG. 2, note that the waveform for node K does indeed reflect the waveform that would be created by a simple AND function of signals E and F.

FIG. 4 illustrates the steps of a first method of reducing the size of a circuit, according to one aspect of the invention. The illustrated example is directed to a user circuit that is to be implemented in a PLD. Reducing the size of a circuit in a PLD can be very advantageous, particularly if the modified circuit fits in a smaller PLD than would the unmodified circuit.

In step 401, a fault simulation is run on a circuit, using a test pattern that provides full coverage of the desired functionality for the circuit. The test pattern might or might not also provide one hundred percent fault coverage for the circuit. The fault simulator identifies non-transitioning nodes in the circuit, i.e., nodes that do not change state while the test pattern is applied to the circuit.

According to previously-known techniques, at this point a user might return to the test pattern and modify the test pattern to ensure that all nodes make a transition. However, according to the present invention, another approach is taken. Instead of modifying the test pattern to perform unnecessary tests, the circuit is modified to remove unnecessary logic.

In optional step 402, the user evaluates a list of non-transitioning nodes provided by the fault simulator in step 401. Known fault simulation software keeps a record of transitions on each node, and can easily be modified to create such a list. (In some embodiments, no such list is created. In some embodiments, where the test pattern is known to be complete, step 402 is unnecessary.) If some of the nodes should have transitioned during the test pattern, but did not, the test pattern can be modified to cause one or more transitions on the non-transitioning node or nodes (optional step 403).

In step 404, the circuit is modified to remove the logic driving the non-transitioning nodes. In some embodiments, the fault simulator creates a list of non-transitioning nodes (as part of step 401), and then trimming software uses the list to trim the logic driving the nodes (step 404). In other embodiments, the fault simulator and the trimming code work interactively to modify the circuit without actually providing a list of non-transitioning nodes. In any case, existing trimming software can be easily used with little or no adaptation to modify the circuit as required by the methods of the invention.

As described above, some existing trimming software provides means by which a user can tag some logic to be retained even if the tagged logic does not appear to be used. Using this feature, in some embodiments of the invention the user can tag some logic to be retained even if the logic drives a non-transitioning node.

In optional step 405, the modified circuit is simulated using a second test pattern to ensure that the functionality of the circuit did not change relative to the first test pattern. The functionality of the circuit might have changed overall, but as long as it still functions correctly in the targeted application, the changes are irrelevant. In some embodiments, the second test pattern is the same as the first test pattern. In other embodiments, the first test pattern can be simpler than the second test pattern. For example, the first test pattern need not check the node values against expected values, so expected values need not be included in the first test pattern.

In optional step 406, the modified circuit is implemented in the targeted PLD. Because the modified circuit is smaller than the original circuit, in some cases the circuit might fit into a smaller PLD than would otherwise have been required. In other cases, the smaller circuit routes more easily in the same PLD, and thus produces a faster implementation. In other embodiments, the circuit will be implemented in a non-programmable device, and reductions in the size of the circuit lead directly to a reduction in size (and hence a reduction in cost) for the resulting device.

Figure 5:
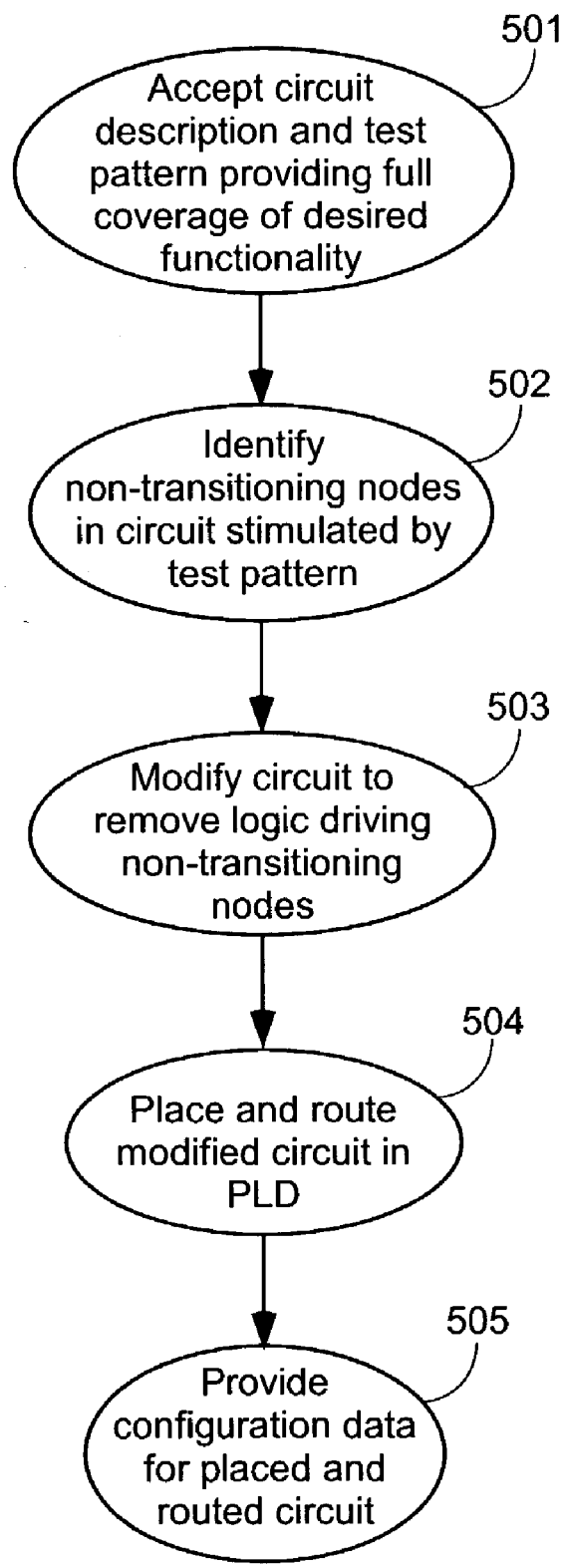
FIG. 5 illustrates the steps of a second method of reducing the size of a circuit, according to another embodiment of the invention.

FIG. 5 illustrates the steps of a second exemplary method of reducing the size of a circuit, according to another embodiment of the invention. This series of steps can be performed, for example, by code included in a PLD implementation software package.

In step 501, a circuit description and test pattern are accepted, where the test pattern provides full coverage of the desired functionality for the circuit. In step 502, non-transitioning nodes are identified for the circuit when the test pattern is applied. In step 503, the circuit is modified to remove the logic driving the non-transitional nodes. Step 503 can also include retaining logic that drives non-transitioning nodes marked for retention.

In optional step 504, the modified circuit is placed and routed in the target PLD. In step 505, configuration data is provided that represents the placed and routed circuit provided by step 504.

Steps 501-503 can also be performed on circuits not targeted for implementation in a PLD.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the methods of the invention in the context of circuits to be implemented in programmable logic devices (PLDs). However, the methods of the invention can also be applied to other electronic circuits, including circuits to be implemented in non-programmable form.

Accordingly, all such modifications and additions are deemed to be within the scope of the invention, which is to be limited only by the appended claims and their equivalents.

What is claimed is:

1. A method of generating a design, the method comprising:
   running a fault simulator on a circuit using a first set of test patterns providing full coverage of desired functionality for the circuit, wherein the fault simulator identifies non-transitioning nodes;
   modifying the circuit to remove logic driving the non-transitioning nodes, wherein modifying the circuit generates a reduced representation of the circuit, the reduced representation including the desired functionality for the circuit;
   incorporating the reduced representation into the design; and
   outputting the design including the reduced representation.

2. The method of claim 1, further comprising:
   simulating the modified circuit using a second set of test patterns to verify that the functionality is unchanged.

3. The method of claim 2, wherein the first and second sets of test patterns are the same.

4. The method of claim 1, wherein the fault simulator creates a list of the non-transitioning nodes.

5. The method of claim 4, further comprising:
   checking the list of non-transitioning nodes to discover whether the first set of test patterns should be modified to cause the non-transitioning nodes to transition; and
   modifying the first set of test patterns after checking the list of non-transitioning nodes, wherein the modified test patterns cause at least one of the non-transitioning nodes to transition.

6. The method of claim 1, wherein the circuit is a user circuit to be implemented in a programmable logic device (PLD).

7. The method of claim 6, further comprising implementing the modified circuit in the PLD.

8. The method of claim 1, wherein modifying the circuit to remove logic driving the non-transitioning nodes includes retaining logic that drives non-transitioning nodes marked for retention.

9. A method of generating a design, the method comprising:
   accepting a circuit description of a circuit and a test pattern providing full coverage of desired functionality for the circuit;
   identifying, based on the circuit description and the test pattern, non-transitioning nodes when the test pattern is applied to the circuit;
   modifying the circuit to remove logic driving the non-transitioning nodes, wherein modifying the circuit generates a reduced representation of the circuit, the reduced representation including the desired functionality for the circuit;
   incorporating the reduced representation into the design; and
   outputting the design including the reduced representation.

10. The method of claim 9, wherein the circuit is a user circuit to be implemented in a programmable logic device (PLD).

11. The method of claim 10, further comprising placing and routing the modified circuit in the PLD.

12. The method of claim 11, further comprising providing configuration data for the circuit placed and routed in the PLD.

13. The method of claim 9, wherein identifying the non-transitioning nodes comprises creating a list of the non-transitioning nodes.

14. The method of claim 9, wherein modifying the circuit to remove logic driving the non-transitioning nodes includes retaining logic that drives non-transitioning nodes marked for retention.

15. An article of manufacture, comprising:
   a computer-readable storage medium comprising computer-executable code for reducing the size of a circuit, the medium comprising:
   code for identifying, based on a circuit description of the circuit and a test pattern providing full coverage of desired functionality for the circuit, non-transitioning nodes when the test pattern is applied to the circuit;
   code for modifying the circuit to remove logic driving the non-transitioning nodes, wherein the code for modifying the circuit generates a reduced representation of the circuit, the reduced representation including the desired functionality for the circuit; and
   code for outputting the reduced representation to a user for inclusion in a user design.

16. The article of manufacture of claim 15, further comprising the circuit description of the circuit.

17. The article of manufacture of claim 15, further comprising the test pattern.

18. The article of manufacture of claim 15, wherein the circuit is a user circuit to be implemented in a programmable logic device (PLD).

19. The article of manufacture of claim 18, further comprising code for placing and routing the modified circuit in the PLD.

20. The article of manufacture of claim 19, further comprising code for providing configuration data for the circuit placed and routed in the PLD.

21. The article of manufacture of claim 15, wherein the code for identifying the non-transitioning nodes comprises code for creating a list of the non-transitioning nodes.

22. The article of manufacture of claim 15, wherein the code for modifying the circuit to remove logic driving the non-transitioning nodes includes code for retaining logic that drives non-transitioning nodes marked for retention.

23. A computer system, comprising:
   a computer;

a computer readable medium storing computer instructions, comprising:

a node identifying module for identifying, based on a circuit description of the circuit and a test pattern providing full coverage of desired functionality for the circuit, non-transitioning nodes when the test pattern is applied to the circuit;

a circuit modifying module for modifying the circuit to remove logic driving the non-transitioning nodes, wherein the circuit modifying module generates a reduced representation of the circuit, the reduced representation including the desired functionality for the circuit; and an outputting module for outputting the reduced representation to a user for inclusion in a user design.

24. The computer system of claim 23, further comprising the circuit description of the circuit.

25. The computer system of claim 23, further comprising the test pattern.

26. The computer system of claim 23, wherein the circuit is a user circuit to be implemented in a programmable logic device (PLD).

27. The computer system of claim 26, further comprising a place and route module for placing and routing the modified circuit in the PLD.

28. The computer system of claim 27, further comprising a configuration data providing module for providing configuration data for the circuit placed and routed in the PLD.

29. The computer system of claim 23, wherein the node identifying module comprises a list creating module for creating a list of the non-transitioning nodes.

30. The computer system of claim 23, wherein the circuit modifying module retains logic that drives non-transitioning nodes marked for retention.

* * * * *